United States Patent
Johnson et al.

(10) Patent No.: US 7,960,287 B2
(45) Date of Patent: Jun. 14, 2011

(54) METHODS FOR FABRICATING FINFET STRUCTURES HAVING DIFFERENT CHANNEL LENGTHS

(75) Inventors: Frank Scott Johnson, Wappingers Falls, NY (US); Richard T. Schultz, Fort Collins, CO (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 12/891,365

(22) Filed: Sep. 27, 2010

(65) Prior Publication Data

US 2011/0014791 A1   Jan. 20, 2011

Related U.S. Application Data

(62) Division of application No. 12/365,300, filed on Feb. 4, 2009, now Pat. No. 7,829,466.

(51) Int. Cl.
  *H01L 21/311* (2006.01)
(52) U.S. Cl. ......... 438/703; 438/197; 438/689; 438/694
(58) Field of Classification Search ............... 257/48, 257/296, 336, 368, 401; 438/703, 197, 585, 438/595, 694, 696, 712, 734
See application file for complete search history.

(56) References Cited

U.S. PATENT DOCUMENTS

| | | | |
|---|---|---|---|
| 7,183,142 B2 * | 2/2007 | Anderson et al. | 438/142 |
| 7,301,210 B2 | 11/2007 | Abadeer et al. | |
| 7,611,980 B2 * | 11/2009 | Wells et al. | 438/597 |
| 2005/0153562 A1 | 7/2005 | Furukawa et al. | |
| 2006/0046200 A1 | 3/2006 | Abatchev et al. | |
| 2007/0215874 A1 | 9/2007 | Furukawa et al. | |
| 2007/0249174 A1 | 10/2007 | Yang | |
| 2010/0075503 A1 * | 3/2010 | Bencher et al. | 438/703 |

OTHER PUBLICATIONS

U.S. Appl. No. 12/412,722, filed Mar. 27, 2009, Schultz et al.

* cited by examiner

*Primary Examiner* — Thanh V Pham
*Assistant Examiner* — Errol Fernandes
(74) *Attorney, Agent, or Firm* — Ingrassia Fisher & Lorenz, P.C.

(57) ABSTRACT

Methods for fabricating FinFET structures having gate structures of different gate widths are provided. The methods include the formation of sidewall spacers of different thicknesses to define gate structures of the FinFET structures with different gate widths. The width of a sidewall spacer is defined by the height of the structure about which the sidewall spacer is formed, the thickness of the sidewall spacer material layer from which the spacer is formed, and the etch parameters used to etch the sidewall spacer material layer. By forming structures of varying height, forming the sidewall spacer material layer of varying thickness, or a combination of these, sidewall spacers of varying width can be fabricated and subsequently used as an etch mask so that gate structures of varying widths can be formed simultaneously.

9 Claims, 8 Drawing Sheets

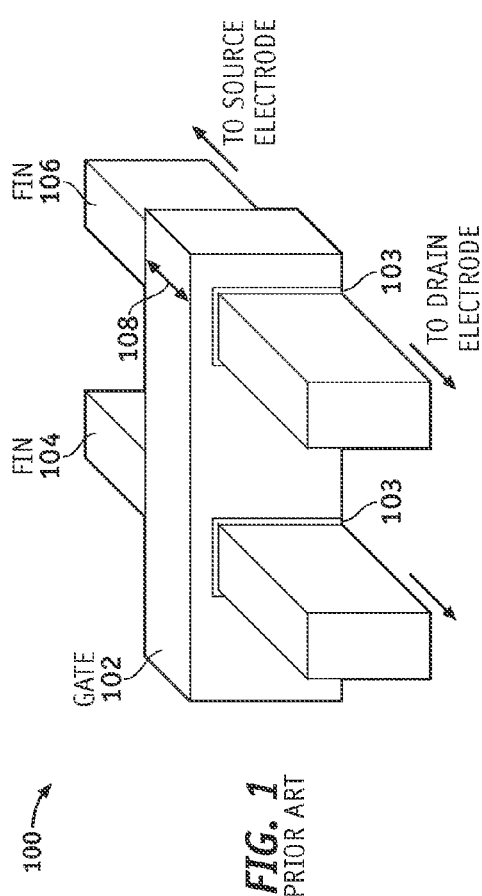
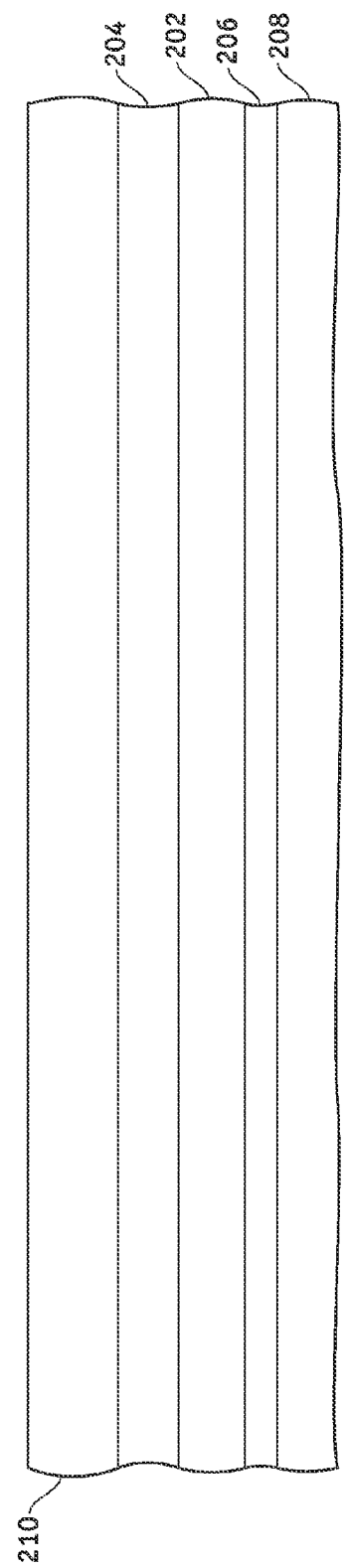

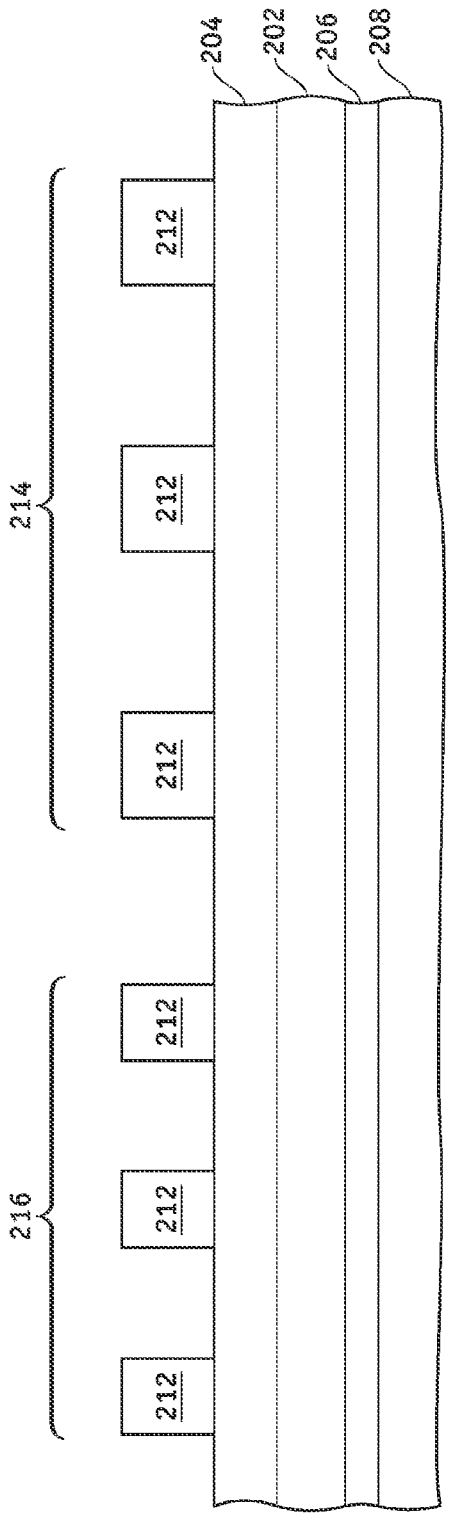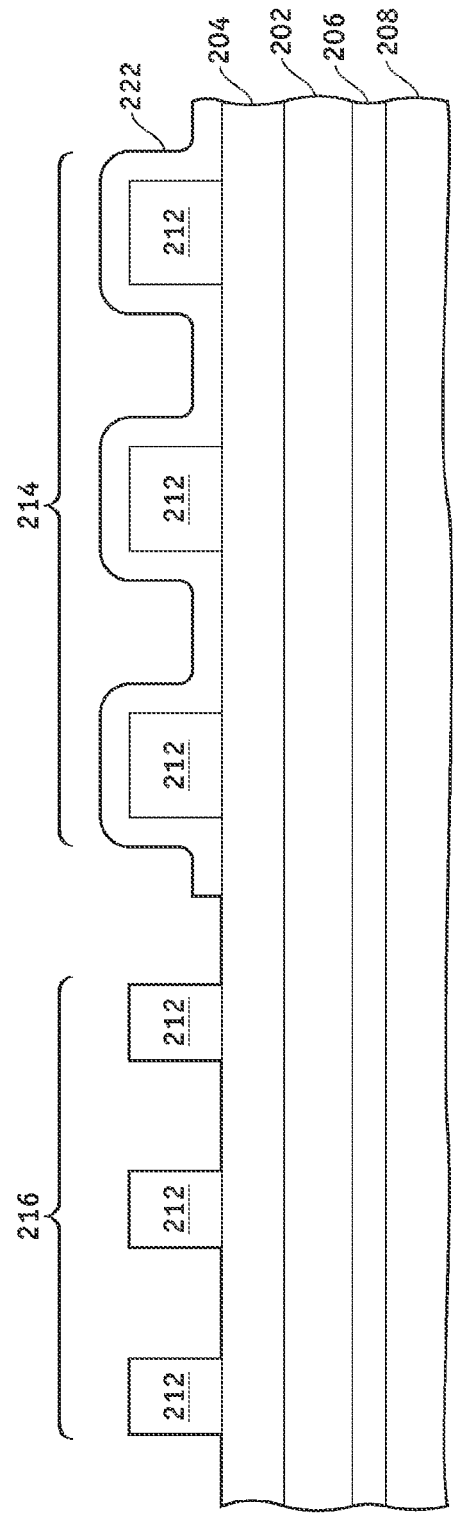

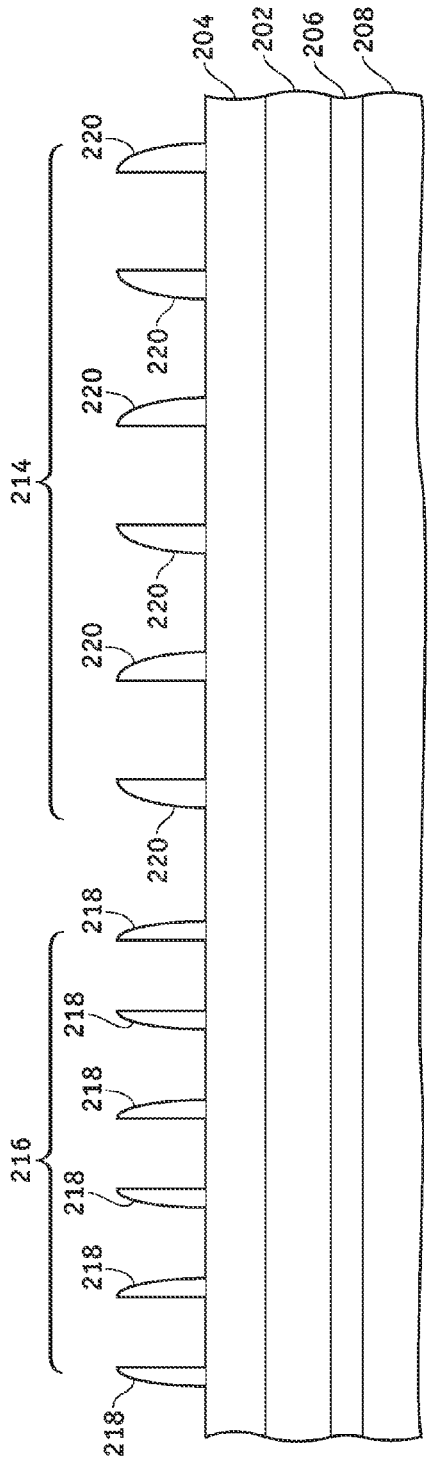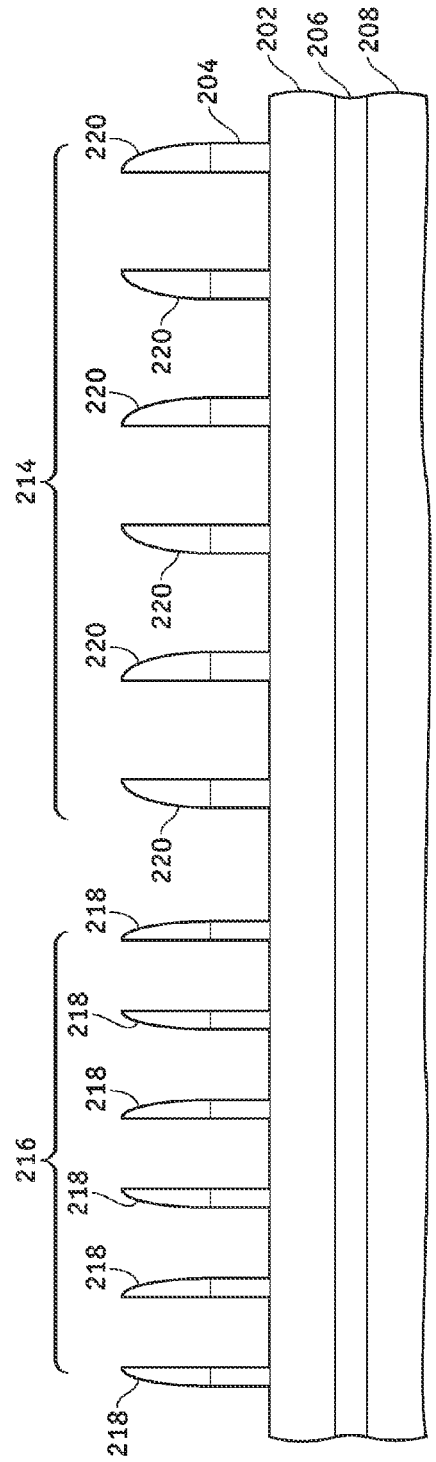

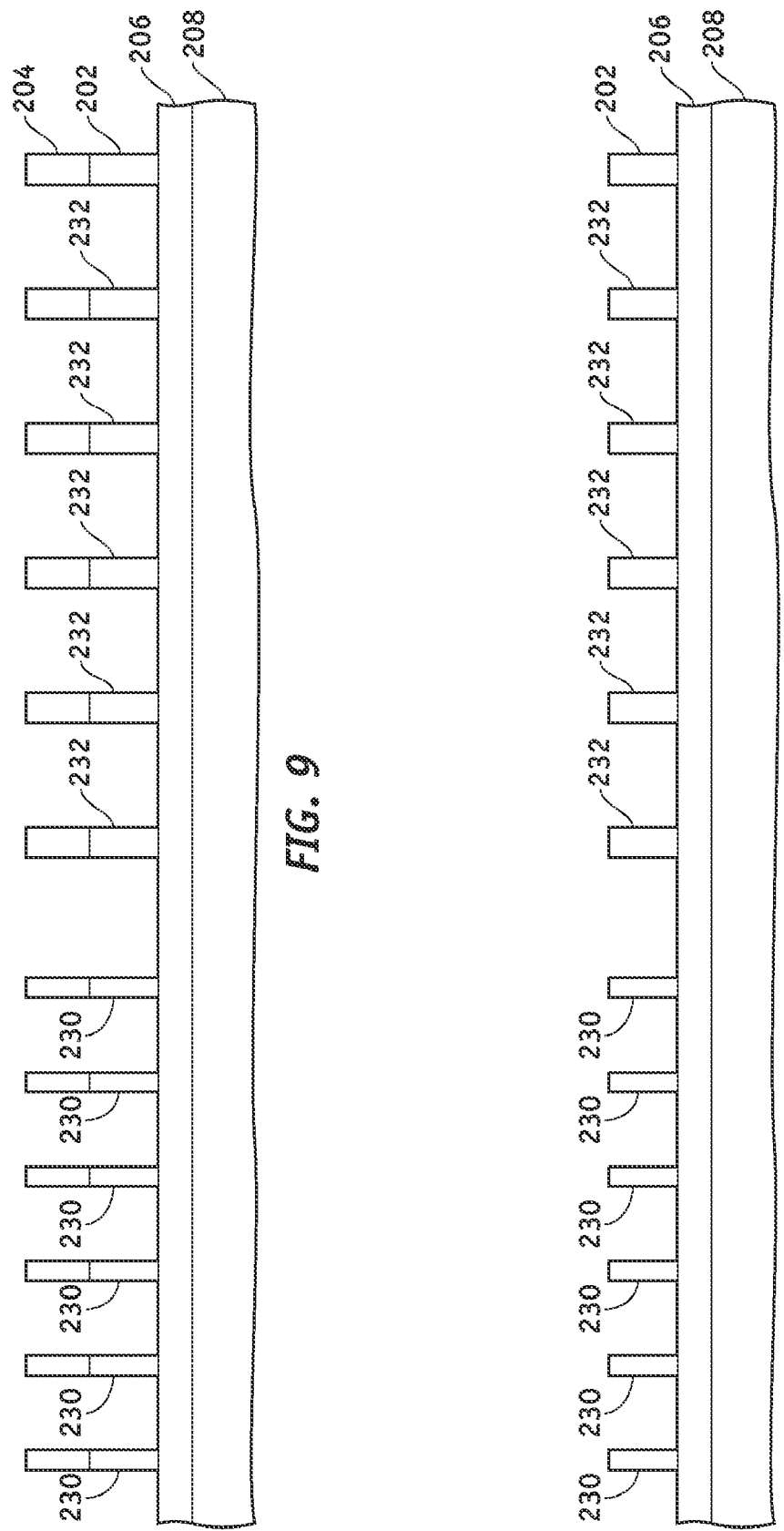

METHODS FOR FABRICATING FINFET STRUCTURES HAVING DIFFERENT CHANNEL LENGTHS

CROSS-REFERENCES TO RELATED APPLICATIONS

This is a division of application Ser. No. 12/365,300, filed Feb. 4, 2009.

FIELD OF THE INVENTION

The present invention generally relates to methods for fabricating semiconductor devices, and more particularly relates to methods for fabricating FinFET structures having different channel lengths.

BACKGROUND OF THE INVENTION

In contrast to traditional planar metal-oxide-semiconductor field-effect transistors (MOSFETs), which are fabricated using conventional lithographic fabrication methods, nonplanar FETs incorporate various vertical transistor structures, and typically include two or more gate structures formed in parallel. One such semiconductor structure is the "FinFET," which takes its name from the multiple thin silicon "fins" that are used to form the respective gate channels, and which are typically on the order of tens of nanometers in width.

More particularly, referring to the exemplary prior art nonplanar FET structure shown in FIG. 1, a FinFET 100 generally includes two or more parallel silicon fin structures (or simply "fins") 104 and 106. These structures are typically formed on a silicon-on-insulator (SOI) substrate (not shown), with fins 104 and 106 extending between a common drain electrode and a common source electrode (not shown). A conductive gate structure 102 "wraps around" three sides of both fins 104 and 106, and is separated from the fins by a standard gate oxide layer 103. Fins 104 and 106 may be suitably doped to produce the desired FET polarity, as is known in the art, such that a gate channel is formed within the near surface of the fins adjacent to gate oxide 103. The width of the gate, indicated by double-headed arrow 108, thus determines the effective channel length of the device.

FinFETs with smaller channel lengths and smaller gate pitch exhibit higher current drive strength and less capacitance, and can operate at higher frequency, thus providing overall increased device performance. However, as semiconductor structures approach the 22 nanometer (nm) and 15 nm technology nodes, FinFETs with small channel lengths may suffer from static current leakage, with the static current leakage increasing as the channel length decreases. In addition, current processes for fabricating such small channel length FinFETs often result in high channel length variability, which can adversely affect transistor performance. While certain transistors of a semiconductor device structure perform functions, such as critical timing, that require short channel lengths, not all transistors of the structure perform such functions. These transistors can be fabricated with greater channel lengths, thus overcoming leakage problems and fabrication variability. In addition, it may be desirable to have N-channel FinFETs and P-channel FinFETs of different channel lengths due to the difference in junction abruptness, charge carrier mobility, and gate electrode work function. However, because of the very small tolerances involved, current methods for fabricating gate structures typically do not provide for the formation of gate structures with different widths and, thus, FinFET structures with different channel lengths.

Accordingly, it is desirable to provide methods for fabricating FinFET structures having gate structures of different widths. In addition, it is desirable to provide methods for simultaneously forming FinFET structures with varying channel lengths. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Methods for fabricating semiconductor structures having different gate widths and, thus, different channel lengths are provided. In accordance with one exemplary embodiment, a method for fabricating semiconductor structures of a first width $W_1$ and semiconductor structures of a smaller second width $W_2$ comprises fabricating a first plurality of mandrels on a hard mask layer overlying a structure-forming material layer and fabricating a second plurality of mandrels on the hard mask layer. A first sidewall spacer-forming material is formed overlying the first plurality of mandrels leaving the second plurality of mandrels exposed. The first sidewall spacer-forming material is deposited to a thickness about equal to the difference between the first width $W_1$ and the second width $W_2$. A second sidewall spacer-forming material is formed overlying the first sidewall spacer-forming material and the second plurality of mandrels. The second sidewall spacer-forming material is deposited to a thickness about equal to the first width $W_1$. The first sidewall spacer-forming material and the second sidewall-spacer material are anisotropically etched to form first sidewall spacers about sidewalls of each of the first plurality of mandrels and second sidewall spacers about sidewalls of each of the second plurality of mandrels. The first sidewall spacers have a base width about equal to first width $W_1$ and the second sidewall spacers have a base width of about equal to the second width $W_2$. The first plurality of mandrels and the second plurality of mandrels are removed and the hard mask layer is etched using the first sidewall spacers and the second sidewall spacers as an etch mask. The structure-forming material layer is etched using the etched hard mask layer as an etch mask.

A method for fabricating semiconductor structures having first channel lengths and second narrower channel lengths is provided in accordance with another exemplary embodiment. The method comprises providing a hard mask layer overlying a gate-forming material layer, depositing a first mandrel-forming material overlying the hard mask layer, and depositing a second mandrel-forming material overlying the first mandrel-forming material. The second mandrel-forming material and the first mandrel-forming material are etched such that a first plurality of mandrels comprising the first mandrel-forming material and the second mandrel-forming material and a second plurality of mandrels comprising the first mandrel-forming material are formed. A sidewall spacer-forming material is deposited overlying the first plurality of mandrels and the second plurality of mandrels. The sidewall spacer-forming material is anisotropically etched to form sidewall spacers about sidewalls of each of the first plurality of mandrels and the second plurality of mandrels. The first plurality of mandrels and the second plurality of mandrels are removed and the hard mask layer is etched using the sidewall spacers as an etch mask. The gate-forming material layer is etched using the etched hard mask layer as an etch mask.

A method for fabricating a semiconductor structure having a first gate structure of a first width $W_1$ and a second gate structure of a smaller second width $W_2$ is provided in accordance with yet another exemplary embodiment of the present invention. The method comprises providing a hard mask layer overlying a gate-forming material layer, depositing a first mandrel-forming material overlying the hard mask layer, and depositing a second mandrel-forming material overlying the first mandrel-forming material. The second mandrel-forming material and the first mandrel-forming material are etched such that a first plurality of mandrels comprising the first mandrel-forming material and the second mandrel-forming material and a second plurality of mandrels comprising the first mandrel-forming material are formed. A first sidewall spacer-forming material is formed overlying the first plurality of mandrels leaving the second plurality of mandrels exposed and a second sidewall spacer-forming material is formed overlying the first sidewall spacer-forming material and the second plurality of mandrels. The first sidewall spacer-forming material and the second sidewall-spacer material are anisotropically etched to form first sidewall spacers about sidewalls of each of the first plurality of mandrels and second sidewall spacers about sidewalls of each of the second plurality of mandrels. The first sidewall spacers have a base width about equal to first width $W_1$ and the second sidewall spacers have a base width of about equal to the second width $W_2$. The first plurality of mandrels and the second plurality of mandrels are removed and the hard mask layer is etched using the first sidewall spacers and the second sidewall spacers as an etch mask. The gate-forming material layer is etched using the etched hard mask layer as an etch mask.

BRIEF DESCRIPTION OF THE DRAWINGS

The present invention will hereinafter be described in conjunction with the following drawing figures, wherein like numerals denote like elements, and wherein:

FIG. 1 is an isometric schematic view of a FinFET structure available in the prior art;

FIGS. 2-10 illustrate, in cross section, methods for fabricating gate structures of FinFET structures having different widths, in accordance with exemplary embodiments of the present invention.

DETAILED DESCRIPTION OF THE INVENTION

Figure 5:
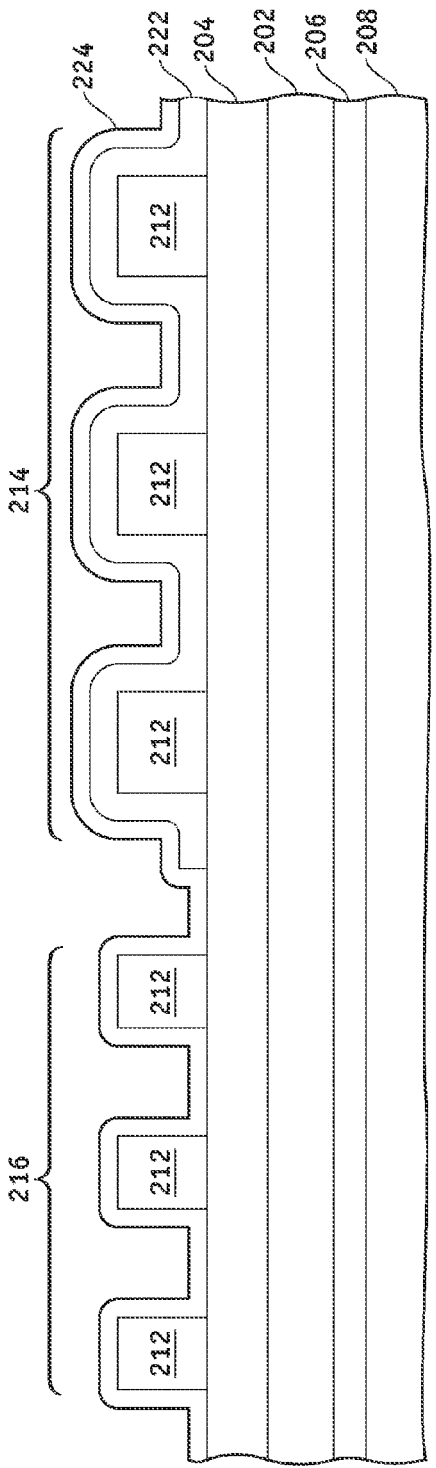

The following detailed description of the invention is merely exemplary in nature and is not intended to limit the invention or the application and uses of the invention. Furthermore, there is no intention to be bound by any theory presented in the preceding background of the invention or the following detailed description of the invention.

FIGS. 2-10 illustrate, in cross section, methods for fabricating semiconductor structures of different widths in accordance with exemplary embodiments of the present invention. While the various embodiments particularly refer to the fabrication of FinFET gate structures having different gate widths, it will be understood that the invention is not so limited and that the methods can be used to form various semiconductor structures. The FinFET gate structures of the different widths can be gate structures of the same FinFET device or gate structures of different FinFET devices. The methods include the formation of sidewall spacers of different thickness to define gate structures of the FinFET structures with different gate widths. The width of a sidewall spacer is defined by the height of the structure about which the sidewall spacer is formed, the thickness of the sidewall spacer material layer from which the spacer is formed, and the etch parameters used to etch the sidewall spacer material layer. By forming structures of varying height, forming the sidewall spacer material layer of varying thickness, or a combination of these, sidewall spacers of varying width can be fabricated and subsequently used as an etch mask so that gate structures of varying widths can be formed simultaneously. In this regard, as different photoresist masks are not used to define the gate structures having different widths, less variability among the minimum channel lengths of the resulting FinFET structures and better gate structure alignment can be achieved. In addition, as gate structures with larger widths can be fabricated along with smaller-width gate structures needed for critical timing paths, static leakage and power consumption of the resulting semiconductor structure can be decreased.

Referring to FIG. 2, in accordance with an exemplary embodiment of the present invention, a method for fabricating FinFET gate structures includes the step of providing a hard mask layer 204 on a gate-forming material layer 202. The gate-forming material is deposited as a blanket layer overlying one or more previously fabricated, silicon-comprising fins (not shown). The fins are formed on a semiconductor substrate. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or, as illustrated, may comprise a buried oxide layer 206 disposed on a support substrate 208. Support substrate 208 is preferably a silicon substrate, which can be either N-type or P-type silicon. Here, the silicon-comprising material from which the fins are formed and buried oxide layer 206 form what is commonly known as a silicon-on-insulator (SOI) structure that, in turn, is supported by support substrate 208.

The gate-forming material layer 202 comprises a conductive material, such as, for example, polycrystalline silicon, one or more metals, or a combination thereof, and has a thickness suitable for a desired device application. Hard mask layer 204 comprises any suitable mask material that exhibits a lower etch rate than the gate-forming material layer 202 when subjected to the same etch chemistry. In this regard, adequate control of the gate-forming etch process, discussed in more detail below, can be achieved. The hard mask layer can be, for example, a layer of silicon nitride. The silicon nitride can be deposited, for example, by LPCVD by the reaction of dichlorosilane and ammonia.

A layer of mandrel-forming material 210 is deposited on the hard mask layer 204. The mandrel-forming material comprises a material having a composition different from that of the hard mask layer 204 so as to achieve high mandrel-to-hard mask layer selectivity. Examples of suitable materials for the mandrel-forming material include, but are not limited to, photoresist, polycrystalline silicon, silicon oxide, silicon nitride, silicon germanium, and the like. In a preferred embodiment, the mandrel-forming material comprises polycrystalline silicon.

Referring to FIG. 3, after deposition of the layer of mandrel-forming material 210, one or more patterned masks (not shown), such as one or more patterned photoresists, is formed on the mandrel-forming material, which then is etched to form a plurality 214 of mandrels 212 and a plurality 216 of mandrels 212 on hard mask layer 204. In one exemplary embodiment, the plurality 214 and the plurality 216 of mandrels 212 are formed simultaneously using one patterned mask. In another exemplary embodiment, a first mask is formed overlying one portion of the mandrel-forming material, which is etched to form either the plurality 214 of mandrels or the plurality 216 of mandrels, and a second mask is formed overlying another portion of the mandrel-forming material, which is then etched to form the other of the plurality 214 of mandrels 212 or the plurality 216 of mandrels 212. The plurality 214 of mandrels 212 has a pitch that is twice the pitch of the widest gate structures to be formed. The plurality 216 of mandrels 212 has a pitch that is twice the pitch of the second widest gate structures to be formed. As the formation of gate structures with only two different widths is illustrated in FIGS. 2-10, the second widest gate structures to be formed are also the narrowest gate structures to be formed. However, the invention is not so limited and gate structures with three, four, or even more different gate widths are contemplated herein. As discussed in more detail below, the height of the mandrels is selected based on the desired or contemplated channel length of the resulting FinFET structures and, hence, the gate width of the subsequently-formed gate structures. In one exemplary embodiment, the plurality 214 of mandrels 212 and the plurality 216 of mandrels 212 have approximately the same height. In another exemplary embodiment, discussed in more detail below, the plurality 214 of mandrels 212 has a height that is larger than the height of the plurality 216 of mandrels 212. The patterned mask is removed after etching the mandrels 212.

Referring to FIG. 4, after formation of mandrels 212, a sidewall spacer material layer 222 is formed overlying the plurality 214 of mandrels 212 leaving the plurality 216 of mandrels exposed. The sidewall spacer material layer 222 comprises a material having a composition different from that of the mandrel-forming material to achieve high mandrel-to-spacer etch selectivity. Materials suitable for sidewall spacer material layer 222 include, for example, silicon nitride and silicon oxide. Preferably, the sidewall spacer material comprises a silicon oxide. Sidewall spacers subsequently formed from the sidewall spacer material layer 222 serve, in part, to define the dimensions of gate structures subsequently fabricated from the plurality 214 of mandrels 212 and, hence, the channel lengths of corresponding FinFET structures. In this regard, sidewall spacer material layer 222 is deposited to a thickness that is substantially equal to the difference between the length of the largest contemplated channel and, hence, the width $W_2$ of the widest contemplated gate structure and the length of the second largest contemplated channel and, hence, the width $W_1$ of the second widest contemplated gate structure, that is, $W_2$-$W_1$. In one exemplary embodiment, the sidewall spacer-forming material 222 is uniformly and conformably deposited overlying the plurality 214 and the plurality 216 of the mandrels 212. After deposition of sidewall spacer material layer 222, a mask (not shown) is deposited overlying sidewall spacer material layer 222 and is patterned to expose the portion of sidewall spacer material 222 that overlies the plurality 216 of mandrels 212. The exposed portion of sidewall spacer material layer 222 then is removed from the plurality 216 of mandrels 212, as illustrated, and the mask is removed.

Next, a sidewall spacer material layer 224 is uniformly and conformably deposited overlying the exposed plurality 216 of mandrels 212 and the sidewall spacer material layer 222, as illustrated in FIG. 5. The sidewall spacer material layer 224 also comprises a material having a composition different from that of the mandrel-forming material to achieve high mandrel-to-spacer etch selectivity. Materials suitable for sidewall spacer material layer 224 include those set forth above that are suitable for sidewall spacer material 222. Preferably, the sidewall spacer material layer 224 comprises a silicon oxide and more preferably comprises the same silicon oxide of sidewall spacer material layer 222. Sidewall spacers subsequently formed from the sidewall spacer material layer 224 about the plurality 216 of mandrels 212 serve to define the dimensions of the narrowest-width gate structures. In addition, sidewall spacers subsequently formed from the sidewall spacer material layer 224 and the sidewall spacer material layer 222 about the plurality of 214 of mandrels 212 serve to define the dimensions of widest gate structures. In this regard, sidewall spacer material layer 224 is deposited to a thickness that is substantially equal to the width of the narrowest contemplated channel length and, hence, the width $W_2$ of the narrowest contemplated gate structure. As noted above, while gate structures of only two thicknesses are illustrated in the figures, it will be appreciated that the invention is not so limited and gate structures of three, four and more widths can be fabricated. Accordingly, the steps of forming a sidewall spacer material layer having a thickness of $W_n$-$W_{n-1}$ overlying the mandrels, where n is the number of different contemplated widths of gate structures to be fabricated, and removing the sidewall spacer material layer from the smaller-width mandrels (i.e., mandrels having width $W_{n-1}$ and less) can be repeated n times to obtain sidewall spacers of n widths. For example, if gate structures having three different widths $W_1$, $W_2$, and $W_3$ are desired, where $W_3$>$W_2$>$W_1$, three pluralities of mandrels of pitch corresponding to the pitch of the three different subsequently-formed gate structures, can be formed, a first sidewall spacer material layer of thickness $W_3$-$W_2$ can be formed overlying the mandrels and removed from the second and third widest mandrels, a second sidewall spacer material layer of thickness $W_2$-$W_1$ can be formed overlying the mandrels and removed from the third widest mandrels, and a third sidewall spacer material layer of thickness $W_1$ can be formed overlying the third widest, or the thinnest mandrels. Methods for defining sidewall spacer widths are well known in the art and, thus, will not be discussed further herein.

Figure 6:
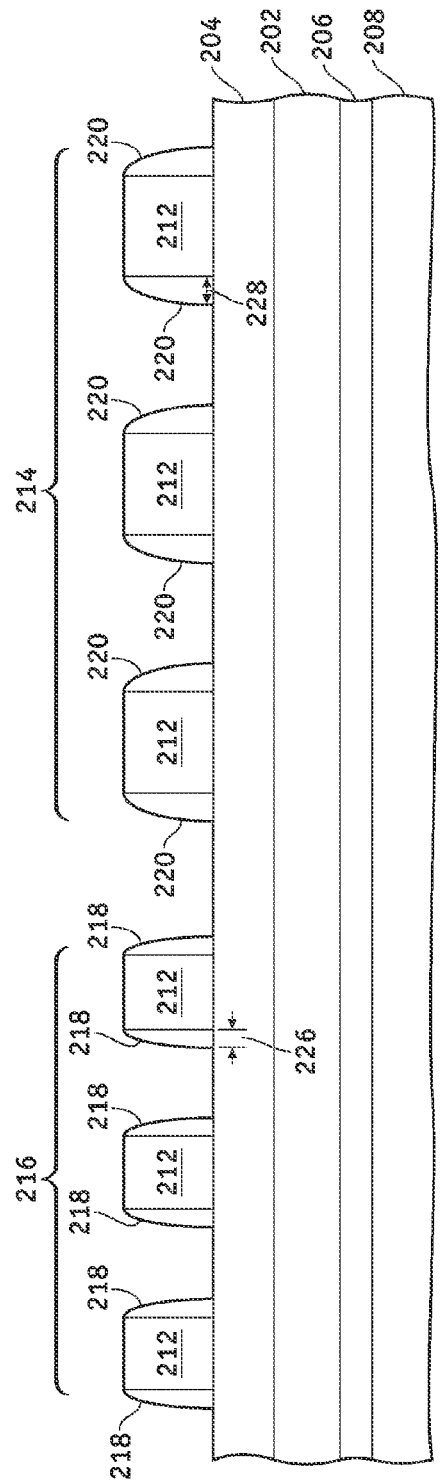

The method continues, as illustrated in FIG. 6, with a blanket anisotropic etch of the sidewall spacer material layers to obtain spacers 220, each having a "base width," that is, a width closest to the hard mask layer 204, indicated by double-headed arrow 228, that corresponds to the width of the widest contemplated gate structures and spacers 218, each having a base width, indicated by double-headed arrows 226, that corresponds to the width of the second widest (or, in this embodiment, narrowest) contemplated gate structures.

Referring to FIG. 7, after formation of the sidewall spacers 218 and 220, the mandrels are removed using an etch chemistry suitable for etching the mandrels while leaving the sidewall spacers in tact. Using the sidewall spacers 218 and 220 as an etch mask, the hard mask layer 204 is etched, as illustrated in FIG. 8. In one exemplary embodiment, the sidewall spacers 218 and 220 then are removed from the etched hard mask layer 204 such that the aspect ratio of etched hard mask layer 204 will be less than the aspect ratio of the sidewall spacers and the etched hard mask layer 204 combined. In this regard, maximum control of the subsequent etching of the gate-forming material layer 202 can be achieved so as to accurately transfer the width of the hard mask layer to the gate structures. Next, as illustrated in FIG. 9, the etched hard mask layer 204 is used as an etch mask during the etching of the gate-forming material 202 to form gate structures 230 and 232 having widths 234 and 236 that are substantially equal to widths 226 and 228 of sidewall spacers 218 and 220 of FIG. 6, respectively. The etched hard mask layer 204 then is removed, as illustrated in FIG. 10, and, thereafter, any number of known process steps can be performed to complete fabrication of FinFET structures, such as that depicted in FIG. 1.

FIGS. 11-16 illustrate, in cross section, methods for fabricating semiconductor structures of different widths in accordance with various other exemplary embodiments of the present invention. While the various embodiments particularly refer to the fabrication of FinFET gate structures having different gate widths, it will be understood that the invention is not so limited and that the methods can be used to form various semiconductor structures. The methods include the formation of sidewall spacers about mandrels of different heights. As explained above, the base widths of the sidewall spacers determine the widths of subsequently-formed gate structures and, hence, channel lengths of desired FinFET structures. The base widths of the sidewall spacers result from the thickness to which a sidewall spacer-forming material is deposited, the etch parameters used to etch the sidewall spacers from the sidewall spacer-forming material, and the height of the mandrels about which the sidewall spacers are formed. Thus, by forming mandrels of different heights, sidewall spacers of different base widths can be formed and, hence, gate structures of different widths can be achieved.

Figure 11:
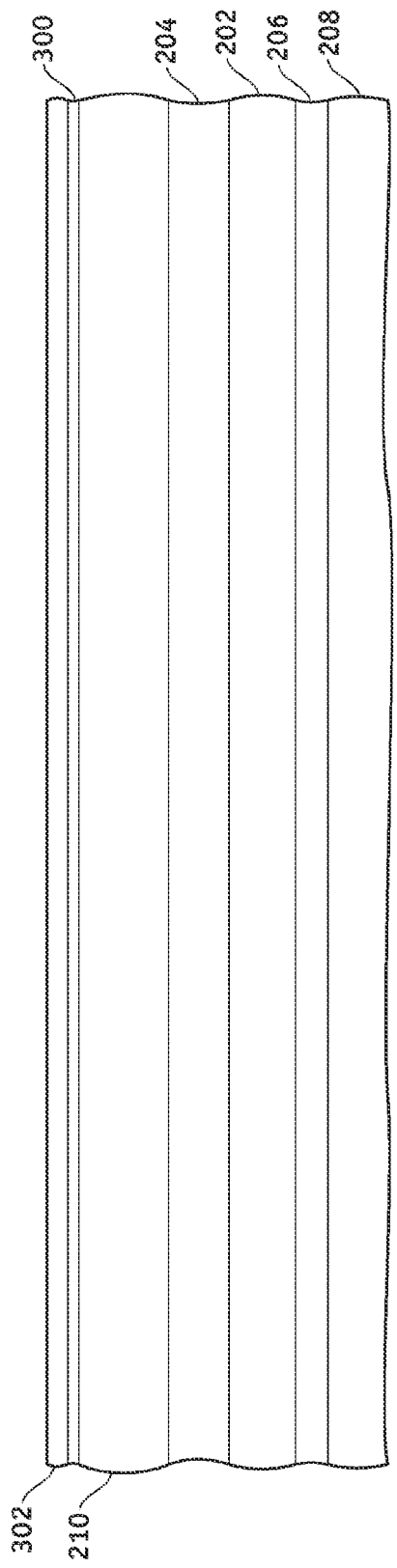
FIGS. 11-16 illustrate, in cross section, methods for fabricating gate structures of FinFET structures having different widths, in accordance with another exemplary embodiment of the present invention.

Referring to FIG. 11, a hard mask layer 204 is provided overlying a gate-forming material layer 202, which in turn overlies silicon-comprising fins (not shown) formed on a buried oxide layer 206. Bottom oxide layer 206 is disposed on a support substrate 208. A layer of mandrel-forming material 210 is deposited on the hard mask layer 204. The mandrel-forming material 210 comprises a material having a composition different from that of the hard mask layer 204 so as to achieve high mandrel-to-hard mask layer selectivity. In one exemplary embodiment, an etch stop layer 300 overlies the mandrel-forming material 210 and a mandrel-forming material layer 302 is disposed on the etch stop layer. The mandrel-forming material layer 302 comprises a material having an etch rate that is faster than the etch rate of the etch stop layer 300 when subjected to the same etch chemistry. In one exemplary embodiment, the etch stop layer comprises a silicon nitride, a silicon oxide, a silicon oxynitride, polycrystalline silicon, or the like. The mandrel-forming material layer 302 may comprise any material described above as suitable for the mandrel-forming material layer 210 and may comprise the same material as the mandrel-forming material layer 210. In a preferred embodiment, the mandrel-forming material layer 302 and the mandrel-forming material layer 210 comprise polycrystalline silicon and the etch top layer 300 comprises silicon oxide. In another embodiment of the present invention, mandrel-forming material layer 302 comprises a material having an etch rate that is faster than an etch rate of the mandrel-forming material layer 210 when subjected to the same etch chemistry. Thus, mandrel-forming material layer 302 may be deposited overlying mandrel-forming material layer 210 without an etch stop layer 300 disposed therebetween. In this embodiment, the mandrel-forming material layer 210 preferably comprises polycrystalline silicon and the mandrel-forming material layer 302 comprises silicon germanium.

Figure 12:
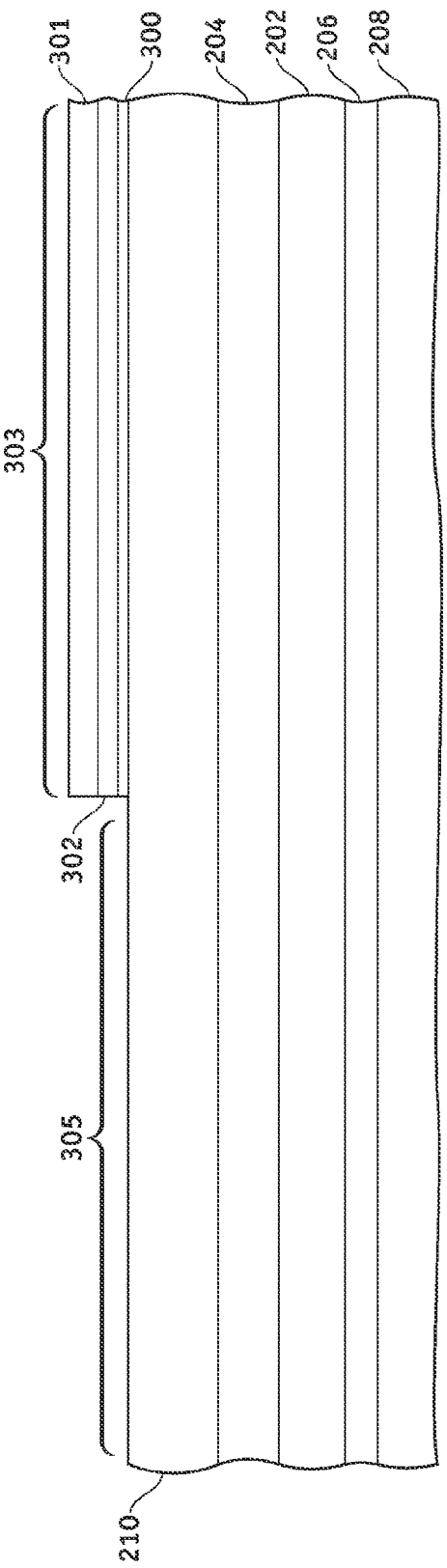

Referring to FIG. 12, after deposition of the layer of mandrel-forming material layer 302, one or more patterned masks 301, such as one or more patterned photoresists, is formed on a portion 303 of the mandrel-forming material layer 302, leaving a portion 305 exposed. The mandrel-forming material layer 302 and the etch stop layer 300, if present, then are removed from portion 305. A polycrystalline silicon mandrel-forming material layer 302 preferably is etched from a silicon oxide etch stop layer 300 using a dry etch, such as, for example, a reactive ion etch using a $Cl_2$ or HBr chemistry. If the etch stop layer is not present, a silicon germanium mandrel-forming material layer 302 preferably is etched from a polycrystalline silicon mandrel-forming material layer 210 using a dry etch, such as, for example, a reactive ion etch using an $SF_6$ and oxygen chemistry. A wet etch using, for example, $NH_4O_2$ and $H_2O_2$, also can be used. The patterned mask 301 then is removed from portion 303.

Figure 13:
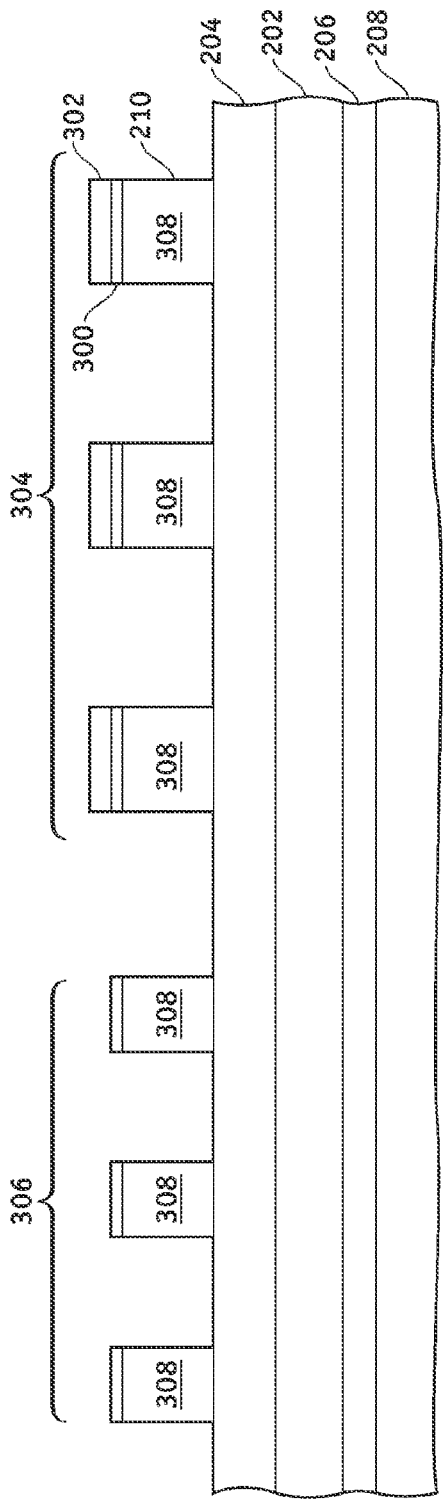

Referring to FIG. 13, after removal of the patterned mask 301, one or more patterned masks (not shown), such as one or more patterned photoresists, is formed on the mandrel-forming material layer 302 and the mandrel-forming material layer 210, which are then etched along with the etch stop layer, if present, to form a plurality 304 of mandrels 308 and a plurality 306 of mandrels 308 on hard mask layer 204. The plurality 304 of mandrels 308 has a pitch that is twice the pitch of the widest gate structures to be formed. The plurality 306 of mandrels 308 has a pitch that is twice the pitch of the second widest gate structures to be formed. The patterned mask is removed after etching the mandrels 308. While mandrels of only two different heights and two different widths/pitches are illustrated in FIGS. 11-16, it will be appreciated that the invention is not so limited and mandrels of three, four, or more different heights and widths/pitches are contemplated herein. In addition, while mandrel formation is illustrated in FIGS. 12 and 13 as being performed after removal of mandrel-forming material layer 302 and etch stop layer 300 from portion 305, it will be appreciated that the mandrels may be formed first followed by the removal of mandrel-forming material layer 302 and etch stop layer 300 from the plurality 306 of mandrels 308.

Figure 14:
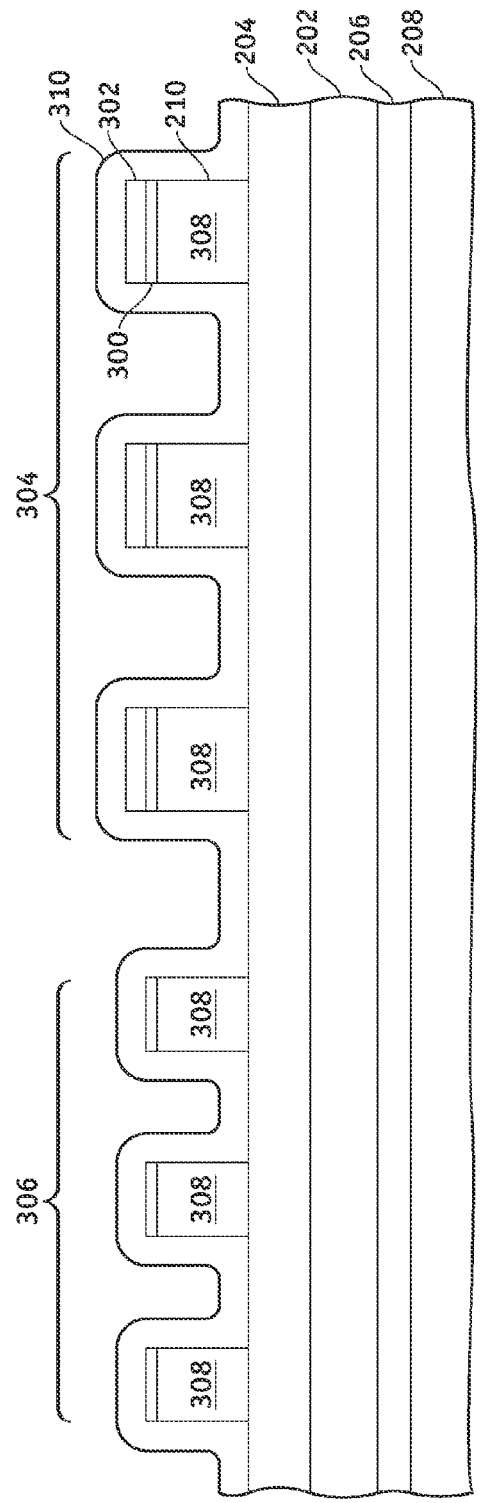

Once the mandrels of varying height are fabricated and all masks are removed, the method continues by depositing a sidewall spacer material layer 310 uniformly and conformably overlying the mandrels 308, as illustrated in FIG. 14. The sidewall spacer material layer 310 comprises a material having a composition different from that of the mandrel-forming material 210, the mandrel forming material 302, and the etch stop layer 300 to achieve high mandrel-to-spacer etch selectivity. Materials suitable for sidewall spacer material layer 310 include, for example, silicon nitride and silicon oxide. Preferably, the sidewall spacer material comprises a silicon oxide. The sidewall spacer material layer 310 is deposited to a thickness that, along with the height of the mandrels 308 and the sidewall spacer-forming etch process parameters, forms sidewall spacers with widths that are substantially equal to the widths of the corresponding gate structures to be fabricated.

Figure 15:
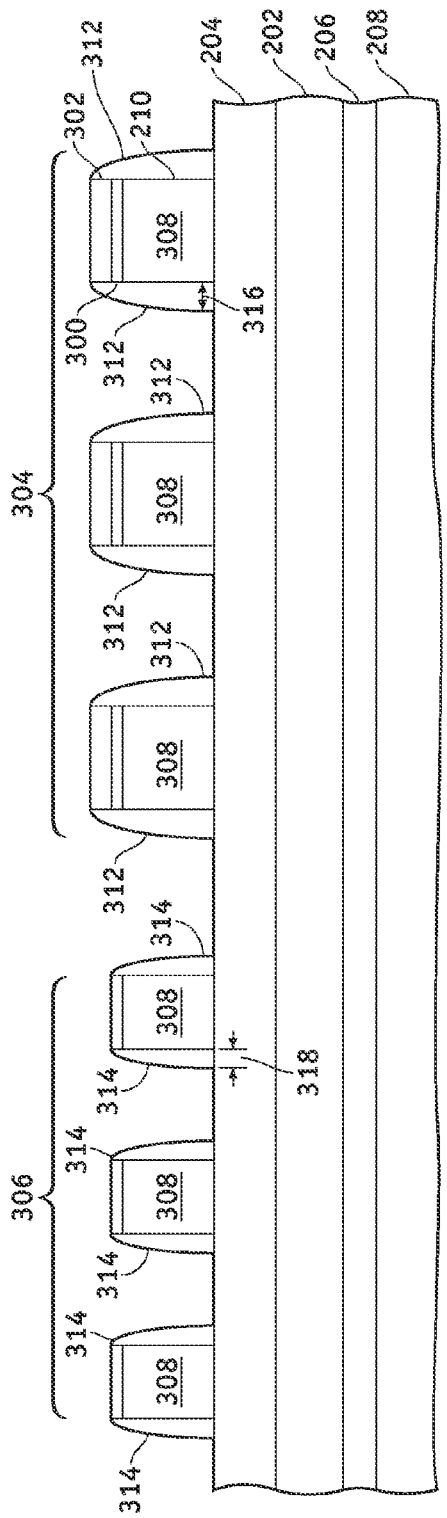

Referring to FIG. 15, a blanket anisotropic etch then is performed to obtain a set of spacers 312, each having a base width, indicated by double-headed arrow 316, that corresponds to the width of the widest contemplated gate structures and a set of spacers 314, each having a base width, indicated by double-headed arrows 318, that corresponds to the width of the second widest contemplated gate structures, which, in this embodiment, are also the thinnest gate structures.

Figure 16:
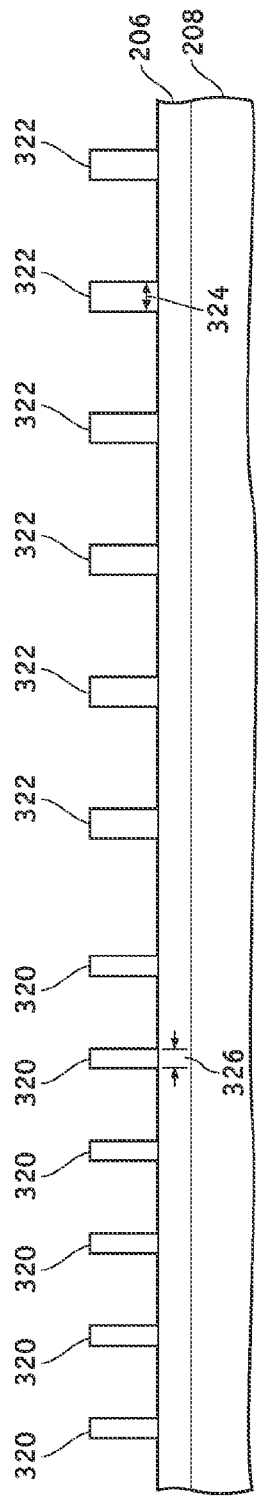

After formation of the sidewall spacers, the method continues as described above with reference to FIGS. 7-10 with the removal of the mandrels 308, the etching of hard mask layer 204, the etching of the gate-forming material layer 202, and the removal of any mask. As illustrated in FIG. 16, gate structures 320 and 322 are thus formed with widths 324 and 326 that are substantially equal to widths 316 and 318 of sidewall spacers 312 and 314 of FIG. 15, respectively. Thereafter, any number of known process steps can be performed to complete fabrication of FinFET structures, such as that depicted in FIG. 1.

In another exemplary embodiment, the methods of FIGS. 2-10 and the methods of FIGS. 11-16 can be combined to form sidewall spacers of varying base width. As noted above, the base widths of sidewall spacers are defined, in part, by the height of the mandrels about which they are formed and the thickness to which the sidewall spacer material layer is formed overlying the mandrels. Accordingly, the above-described methods can be combined such that mandrels of varying height are fabricated and sidewall spacer material layers of varying thickness are formed overlying the mandrels. By adjusting or "tuning" these two parameters, sidewall spacers of different and desired base widths can be achieved.

Accordingly, methods for fabricating FinFET gate structures of different widths and, hence, FinFET structures with different channel lengths have been provided. In this regard, as different photoresist masks are not used to define the gate structures having different widths, less variability among the minimum channel lengths of the FinFET structures and better gate structure alignment can be achieved. In addition, as gate structures with larger widths can be fabricated along with smaller-width gate structures needed for critical timing paths, static leakage and power consumption of the resulting semiconductor structure can be decreased.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for fabricating semiconductor devices having first channel lengths and second narrower channel lengths, the method comprising the steps of:

providing a hard mask layer overlying a gate-forming material layer;

depositing a first mandrel-forming material overlying the hard mask layer;

depositing a second mandrel-forming material overlying the first mandrel-forming material;

etching the second mandrel-forming material and the first mandrel-forming material such that a first plurality of mandrels comprising the first mandrel-forming material and the second mandrel-forming material and a second plurality of mandrels comprising the first mandrel-forming material are formed;

depositing a sidewall spacer-forming material overlying the first plurality of mandrels and the second plurality of mandrels;

anisotropically etching the sidewall spacer-forming material to form sidewall spacers about sidewalls of each of the first plurality of mandrels and the second plurality of mandrels;

removing the first plurality of mandrels and the second plurality of mandrels;

etching the hard mask layer using the sidewall spacers as an etch mask; and etching the gate-forming material layer using the etched hard mask layer as an etch mask.

2. The method of claim 1, further comprising the steps of:
forming an etch stop layer overlying the first mandrel-forming material before the step of depositing a second mandrel-forming material; and
wherein the step of etching the second mandrel-forming material and the first mandrel-forming material comprises etching the second mandrel-forming material, the etch stop layer, and the first mandrel-forming material.

3. The method of claim 1, further comprising removing the second mandrel-forming material overlying a portion of the first mandrel-forming material before the step of etching the second mandrel-forming material and the first mandrel-forming material.

4. The method of claim 3, wherein the step of etching the second mandrel-forming material and the first mandrel-forming material comprises removing the second mandrel-forming material from the second plurality of mandrels.

5. The method of claim 1, further comprising the step of removing the sidewall spacers after the step of etching the hard mask layer and before the step of etching the gate-forming material layer.

6. The method of claim 1, wherein the step of etching the gate-forming material layer comprises forming first gate structures having widths substantially equal to the first channel lengths and second gate structures having widths substantially equal to the second narrower channel lengths.

7. The method of claim 6, wherein the step of etching the second mandrel-forming material and the first mandrel-forming material comprises forming a first plurality of mandrels having a pitch that is twice the pitch of the first gate structures.

8. The method of claim 7, wherein the step of etching the second mandrel-forming material and the first mandrel-forming material comprises forming a second plurality of mandrels having a pitch that is twice the pitch of the second gate structures.

9. The method of claim 1, wherein the step of anisotropically etching comprises anistropically etching the sidewall spacer-forming material to form first sidewall spacers about the sidewalls of each of the first plurality of mandrels and second sidewall spacers about the sidewalls of the second plurality of mandrels, wherein the first sidewall spacers have a width that is substantially equal to the first channel lengths and the second sidewall spacers have a width that is substantially equal to the second narrower channel lengths.

* * * * *